(12) United States Patent
Chikaki et al.

(10) Patent No.: US 8,273,410 B2
(45) Date of Patent: Sep. 25, 2012

(54) PROCESS FOR MANUFACTURING HYDROPHOBIZED MICROPOROUS FILM

(75) Inventors: Shinichi Chikaki, Ibaraki (JP); Takahiro Nakayama, Ibaraki (JP)

(73) Assignees: Renesas Electronics Corporation, Kanagawa (JP); ULVAC Inc., Kanagawa (JP)

( * ) Notice: Subject to any disclaimer, the term of this patent is extended or adjusted under 35 U.S.C. 154(b) by 152 days.

(21) Appl. No.: 12/680,275

(22) PCT Filed: Sep. 29, 2008

(86) PCT No.: PCT/JP2008/002714
§ 371 (c)(1),
(2), (4) Date: Mar. 26, 2010

(87) PCT Pub. No.: WO2009/044529
PCT Pub. Date: Apr. 9, 2009

(65) Prior Publication Data
US 2010/0221433 A1    Sep. 2, 2010

(30) Foreign Application Priority Data
Oct. 5, 2007    (JP) ................ 2007-261620

(51) Int. Cl.
*C23C 16/00* (2006.01)
*B05D 3/04* (2006.01)
(52) U.S. Cl. ........................ 427/337; 427/331
(58) Field of Classification Search ........................ None
See application file for complete search history.

(56) References Cited

U.S. PATENT DOCUMENTS

| 6,448,331 | B1 | 9/2002 | Ioka et al. |
| 7,772,130 | B2 | 8/2010 | Miyoshi et al. |
| 7,807,267 | B2 | 10/2010 | Kohmura et al. |
| 2004/0096586 | A1* | 5/2004 | Schulberg et al. ......... 427/372.2 |
| 2007/0275568 | A1* | 11/2007 | Miyoshi et al. ............. 438/778 |
| 2009/0207390 | A1* | 8/2009 | Fukuoka et al. ............. 355/27 |

FOREIGN PATENT DOCUMENTS

CN    1871696    11/2006
(Continued)

OTHER PUBLICATIONS

Mor, J. Vac. Sci. Technolog. B, V20, No. 4, Jul./Aug. 2002, p. 1234.*
(Continued)

*Primary Examiner* — Timothy Meeks
*Assistant Examiner* — Joseph Miller, Jr.
(74) *Attorney, Agent, or Firm* — Young & Thompson

(57) ABSTRACT

A process for manufacturing a hydrophobized microporous film includes: forming an organic silica insulating film 2 on a substrate 1; supplying a gaseous mixture 3 composed of a silylation gas and an inert gas in an apparatus having the substrate 1 disposed therein at a temperature of the substrate 1, the substrate 1 having the organic silica insulating film 2 formed thereon, and the temperature being equal to or higher than a dew point temperature of the silylation gas and equal to or lower than a vaporizing temperature of the silylation gas; stopping the supply of the gaseous mixture 3 into the apparatus; and heating the substrate having the organic silica insulating film 2 formed thereon, so that a hydrophobizing organic silica insulating film, in which the surface of the organic silica insulating film 2 and the surfaces of the pores are hydrophobized, can be obtained with reduced increase in the specific dielectric constant.

8 Claims, 3 Drawing Sheets

FOREIGN PATENT DOCUMENTS

| | | |
|---|---|---|
| JP | 2002-033314 | 1/2002 |
| JP | 2005-166716 | 6/2005 |
| JP | 2005-236285 | 9/2005 |
| JP | 2005-272188 | 10/2005 |
| JP | 1681737 | 10/2005 |
| JP | 2007-281283 | 10/2007 |
| WO | 99/03926 | 1/1999 |
| WO | 00/02233 | 1/2000 |
| WO | 2005/034194 | 4/2005 |

OTHER PUBLICATIONS

Bauer, J. Electr. Materials, vol. 30, No. 4, 2001, p. 304.*
International Search Report—PCT/JP2008/002714—Nov. 4, 2008.
European Search Report—EP 08 83 6263—Aug. 31, 2010.
Korean Official Action—10-2010-7005825—Jun. 16, 2011.
English Translation of Notification of the First Office Action issued Aug. 22, 2011 in Chinese Application No. 200880110373.7.
Chinese Official Action—200880110373.7—Jun. 18, 2012.

* cited by examiner

PROCESS FOR MANUFACTURING HYDROPHOBIZED MICROPOROUS FILM

TECHNICAL FIELD

The present invention relates to a process for manufacturing a hydrophobized microporous film.

BACKGROUND ART

Microporous films, which are generally employed as interlayer insulating films for semiconductor devices having multi-layer interconnect structures, exhibit easier absorbability of moisture contained in the air or the like, and thus modifications such as hydrophobic treatment and the like are conducted. The compatibility between the characteristic of allowing a modifier rapidly uniformly penetrating into a microporous film and the characteristic of allowing the surplus amount of a modifier remained after the treatment being immediately exhausted, is required for modifying the surface of the microporous film with the modifier. A diameter of a pore in a microporous film, which is employed in an interlayer insulating film of a semiconductor integrated circuit device, is sufficiently smaller than the pattern size, and more specifically equal to or smaller than 5 nm. Therefore, a modifying gas or a modifying chemical solution cannot be easily reached to the pore surface in the inside of the microporous film.

As a technology for hydrophobizing a microporous film formed on a substrate, for example, Patent Document 1 describes a hydrophobic treatment for a microporous film formed on a substrate, in which a gaseous organosilane compound having hydrophobic group is introduced in a hydrophobic processor and then the hydrophobic treatment is conducted at a temperature ranging from 0 degree C. to 450 degrees C.

Patent Document 2 describes that a hydrophobization of a medium-porous oxide film is achieved by diffusing a silylation agent in a silylation process for the medium-porous oxide film on a substrate at a temperature ranging from about 25 degrees C. to about 200 degrees C.

Patent Document 3 describes that a substrate is cooled to a temperature ranging from about 100 Kelvin to about 300 Kelvin to easily cause a condensation of a hydrophobizing agent on a wafer, and then the wafer is heated to a temperature ranging from about 300 degrees C. to about 450 degrees C. in order to activate the hydrophobizing agent.

Patent Document 4 describes that a surface of a nanoporous silica is coated with a reinforcement agent (silylation agent) in a form of a vapor or a liquid, and then the coated surface is dried, and then is baked at a maximum temperature up to 425 degrees C. In addition, the disclosure also deliberately includes an aspect, in which a mixture of 50% of hexamethyldisilazane of (HMDZ) and 50% of 3-pentanone is employed as a silylation agent.

[Patent Document 1] Japanese Laid-Open Patent Publication No. 2005-272188
[Patent Document 2] Japanese Laid-Open Patent Publication No. 2002-33314
[Patent Document 3] Japanese Laid-Open Patent Publication No. 2005-236285
[Patent Document 4] Japanese Laid-Open Patent Publication No. 2007-508691

However, the processes described in Patent Documents 1 and 2 inherently include the phenomenon, in which volatile components such as water adsorbed on pores in the microporous film vaporizes under the condition of increasing the temperature of hydrophobizing gas before the hydrophobizing gas diffuses in the microporous film, to fill the pores of the microporous film with the vaporized components, and then vaporized components, in turn, are released from the microporous film. Therefore, such phenomenon causes problems, in which a diffusion of the hydrophobizing gas within the microporous film is obstructed, so that the time required for the hydrophobizing treatment is increased.

On the other hand, when the concentration of the hydrophobizing gas is increased under the condition of elevating temperature in order to reduce the hydrophobizing processing time, the hydrophobizing gas are easily precipitated into the fine particles on the microporous film. One of the reasons for precipitating the hydrophobizing gas into the fine particles is that molecules of hydrophobizing gas mutually react under the condition of elevating temperature before the hydrophobizing gas is reached in the interior of the microporous film to extensively grow, creating fine particles, which, in turn adhere the surface of the microporous film. Another reason may be that an excessive hydrophobizing gas aggregates on the surface of the microporous film, and the hydrophobizing gas precipitates into fine particles by heating via elevating temperature. Such precipitates created from the fine particles of the hydrophobizing gas provide an inhibition to the diffusion of the hydrophobizing gas into the interior of the microporous film, failing to provide sufficient hydrophobizing effect of that microporous film. Therefore, an adsorption of water is occurred on the microporous film, causing a problem of increased specific dielectric constant.

Since the process described in Patent Document 3 involves cooling the substrate at a temperature ranging from about 100 Kelvin to about 300 Kelvin, the hydrophobizing agent is condensed on the surface of the microporous film and then the condensed liquid is dried by the heat to create the particles on the surface of the microporous film, causing a problem of failing hydrophobization in the inside of the pores of the microporous film. In addition, it is considered that, since it is heated under the presence of surplus hydrophobizing agent, surplus hydrophobizing gas agglomerates on the surface of the microporous film, so that the hydrophobizing gas precipitate into fine particles by heating via elevating temperature.

Such precipitates generated on the surface of the microporous film may cause a shape defect in the process for patterning the microporous film of the semiconductor device.

The process described in Patent Document 4 may achieve insufficient hydrophobizing treatment over the surface of the microporous film and the interior of the pore. In particular, the use of a mixture of a solvent and a silylation agent may cause a condensation of the solvent on the surface of the microporous film and in the interior of the pore in the low temperature treatment, and such condensed liquid causes a problem of generating particles on the surface of the microporous film or stuffing the inside of the pore. On the other hand, the high temperature treatment may also cause a problem of vaporizing the solvent, which is then changed to a reactive gas.

Results of the investigations of the present inventors for solving such problem show that it was found that the hydrophobization can be achieved in the inside of the pores of the microporous film, when a gaseous mixture of a silylation gas and an inert gas is employed and a temperature being equal to or higher than a dew point temperature of the silylation gas and equal to or lower than a vaporizing temperature of the silylation gas is employed for the temperature of the substrate.

According to one aspect of the present invention, there is provided a process for manufacturing a hydrophobized microporous film, including: forming a microporous film on a substrate; supplying a gaseous mixture composed of a silylation gas and an inert gas in an apparatus having the substrate disposed therein at a temperature of the substrate, the substrate having the microporous film formed thereon, and the temperature being equal to or higher than a dew point temperature of the silylation gas and equal to or lower than a vaporizing temperature of the silylation gas; stopping the supply of the gaseous mixture into the apparatus; and heating the substrate having the microporous film formed thereon.

In the process for manufacturing the hydrophobized microporous film, the gaseous mixture composed of the silylation gas and the inert gas is supplied under the condition that the temperature of the substrate in the apparatus is equal to or higher than a dew point temperature of the silylation gas and equal to or lower than a vaporizing temperature of the silylation gas. More specifically, the substrate temperature is specified as being equal to or higher than a dew point temperature of the silylation gas and equal to or lower than a vaporizing temperature of the silylation gas, on the premise that the gaseous mixture composed of the silylation gas and the inert gas is supplied. This allows penetrating the silylation gas over the surface of the microporous film and in the inside of the pores. Further, the substrate is heated once the supply of the gaseous mixture is stopped, so that the surface of the microporous film and the interior of the pores are hydrophobized with the entered silylation gas. According to the process for manufacturing the hydrophobized microporous film as described above, the process for manufacturing the hydrophobized microporous film with reduced time required for the hydrophobizing processing and reduced increase in the specific dielectric constant can be obtained.

According to the present invention, the process for manufacturing the hydrophobized microporous film with reduced time required for the hydrophobizing processing and reduced increase in the specific dielectric constant can be obtained.

BRIEF DESCRIPTION OF THE DRAWINGS

The above and other objects, advantages and features of the present invention will be more apparent from the following description of certain preferred embodiments taken in conjunction with the accompanying drawings, in which.

BEST MODE FOR CARRYING OUT THE INVENTION

Figure 1:
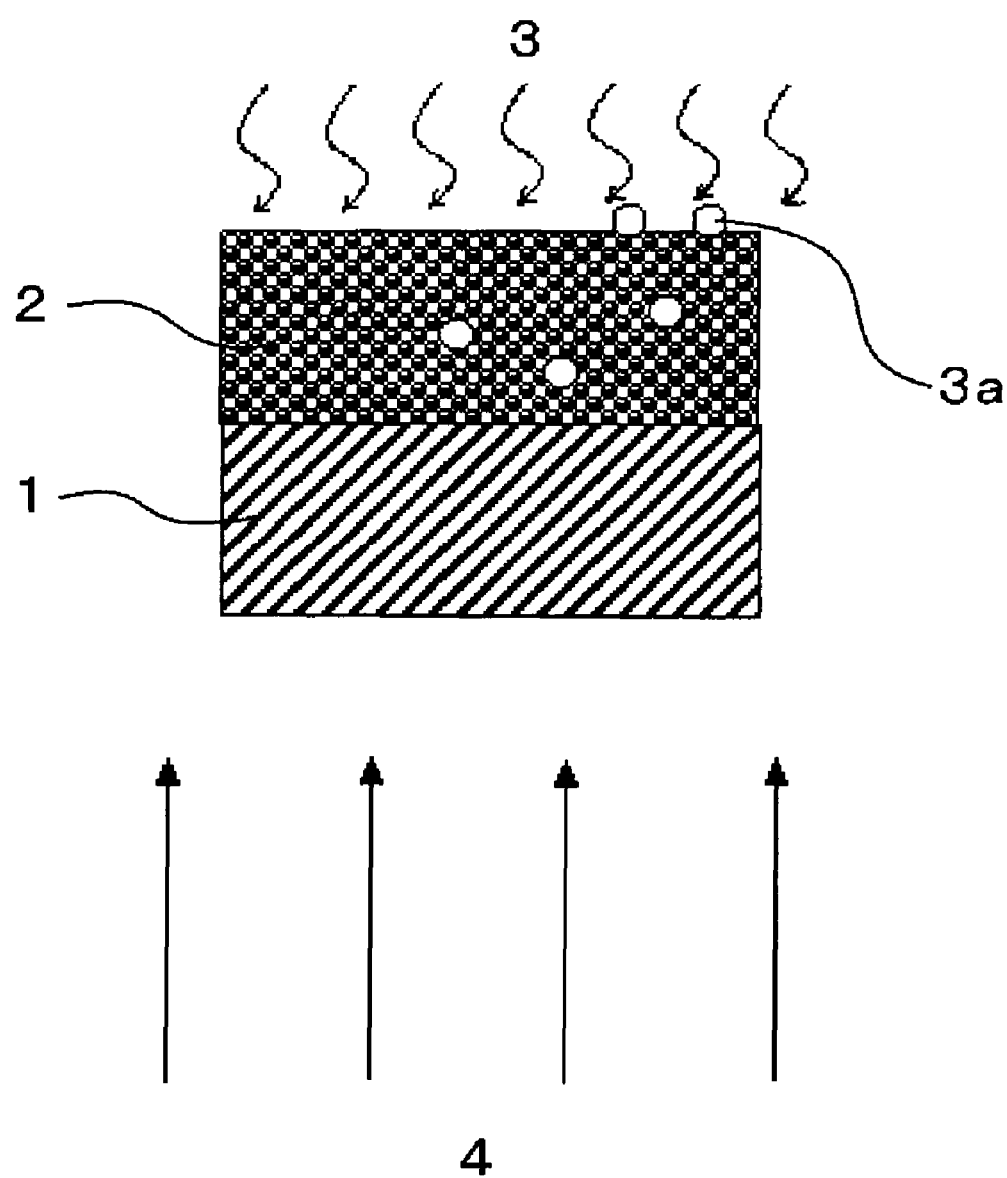
FIG. 1 is a schematic diagram, illustrating an embodiment of a process for manufacturing a hydrophobized microporous film according to the present invention.

Preferable embodiments of processes for manufacturing microporous films according to the present invention will be described in reference to the annexed figures. In all figures, an identical numeral is referred to a component commonly appeared in the drawings, and duplicated descriptions for such component will not be repeated.

(First Embodiment)

A process for manufacturing a microporous film of the present embodiment will be described. FIG. 1 is a schematic diagram, illustrating a process for manufacturing a microporous film of the present embodiment. As shown in FIG. 1, a substrate 1 having an organic silica insulating film 2 formed thereon is disposed in an apparatus (not shown). The substrate 1 is heated by an irradiation of an infrared lamp 4 from the downward. A gaseous mixture 3 is supplied over the upside of the organic silica insulating film 2 formed on the substrate 1. Since the temperatures of the substrate 1 and the organic silica insulating film 2 are equal to or higher than the dew point and equal to or lower than the vaporizing temperature of a silylation gas contained in the gaseous mixture 3, the gaseous mixture 3 diffuses over the surface of the organic silica insulating film 2 and to the inside of the organic silica insulating film 2 to cause the adsorption of the silylation gas contained in the gaseous mixture 3 on the surfaces of the pores (adsorbed silylation gas 3a).

The gaseous mixture 3 is composed of the silylation gas and an inert gas. The dew point temperature of the silylation gas varies with the pressure of the gaseous mixture 3. Therefore, the temperature of the substrate 1 is suitably adjusted according to the pressure of the gaseous mixture 3 in the apparatus.

The dew point temperature of the silylation gas may be preferably −50 degrees C. to 200 degrees C., and the vaporizing temperature thereof may be preferably 0 degrees C. to 250 degrees C. These conditions allow the adsorption of the silylation gas on the internal surfaces of the pores of the organic silica insulating film 2 (a microporous film), which provides improved hydrophobizing effects.

The vaporizing temperature of the silylation gas varies with the pressure of the introduced gaseous mixture 3. The inert gas is employed as a carrier for the silylation gas to vaporize the silylation gas. More specifically, helium gas or nitrogen gas is preferably employed for the inert gas.

The temperature of the substrate 1 is set at a temperature of equal to or higher than the dew point and equal to or lower than the vaporizing temperature of the silylation gas, so that the silylation gas contained in the gaseous mixture 3 supplied over the organic silica insulating film 2 can diffuse over the surface of the organic silica insulating film 2 and the internal pores.

In the present embodiment, the diffusion of the gaseous mixture 3 means that the gaseous mixture 3 penetrates over the surface of the organic silica insulating film 2 and the surfaces of the internal pores. In addition, in the present embodiment, the adsorption of the silylation gas means the condition before a condition, in which terminal hydrophilic group S—OH in the surface and the surfaces of the internal pores of the organic silica insulating film 2 reacts with the silylation gas to create dehydrogenation bonds to achieve the hydrophobizing effects.

The process for manufacturing the microporous film of the present embodiment will be fully described.

Step 101: The organic silica insulating film 2 is formed on the substrate 1.

A mixed solution of siloxane, an acid and an organic monomer is applied over the substrate 1, and the temperature of the substrate 1 is stepwise elevated from 100 degrees C. to 400 degrees C. within an atmosphere of nitrogen. An aggregated material of the organic monomer is generated during the elevation of the temperature, and siloxane is polymerized so as to surround it, and then, the aggregated material of the organic monomer is thermally decomposed to form the organic silica insulating film 2 having open-type pores on the substrate 1. As such, the substrate 1 having the organic silica insulating film 2 formed thereon is obtained.

Step 103: The temperature of substrate 1 is set to be equal to or higher than the dew point and equal to or lower than the vaporizing temperature of the silylation gas in the apparatus containing the substrate 1 having the organic silica insulating film 2 formed thereon, and the gaseous mixture 3 is supplied into the apparatus.

The substrate 1 is capable of being heated to an arbitrarily-defined temperature by exposing the substrate 1 with the infrared lamp 4 from the downward of the substrate 1.

The temperature of the substrate 1 is equal to or higher than the dew point of the silylation gas, so that the particulate-formation of the silylation gas, which is once condensed to liquefy on the surface of the organic silica insulating film 2 and then is heated to create particles, can be avoided. Further, the block of the inside of the pore in the organic silica insulating film 2 with the liquefied silylation gas can be avoided.

Besides, the temperature of the substrate 1 is equal to or lower than the vaporizing temperature of the silylation gas, so that the silylation gas diffuses over the inside of the pore in the organic silica insulating film 2 and the adsorption of the silylation gas on the surface of the organic silica insulating film 2 and the surface of the pore (adsorbed silylation gas 3a) is occurred.

A verification on whether the silylation gas successfully diffuses in the inside of the organic silica insulating film 2 (microporous film) or not can be achieved by, for example, taking the substrate 1 out after the supply of the silylation gas, and heating the substrate 1 without the presence of the silylation gas, and then conducting a pyrolysis mass spectrometry for the substrate 1 to confirm an increase of the mass of the substrate 1. The pressure of the gaseous mixture 3 in the apparatus is maintained at a predetermined pressure by suitably adjusting the supply of the gaseous mixture 3 or the like. The pressure of the gaseous mixture 3 in the apparatus may be preferably being equal to or higher than 1 kPa and equal to or lower than 30 kPa. This allows easy adsorption of the silylation gas containing in the gaseous mixture 3 on the surface of and the pore surfaces in the organic silica insulating film 2, providing further improved hydrophobizing effect.

Step 105: The supply of the gaseous mixture 3 in the inside of apparatus is stopped. The pressure of the gaseous mixture 3 in the apparatus is reduced by stopping the supply of the gaseous mixture 3 in the inside of apparatus. More specifically, excessive gaseous mixture 3 in the apparatus is removed. This allows aggregation of the excessive silylation gas contained in the gaseous mixture 3 on the surface of the organic silica insulating film 2, inhibiting the generation for the fine particles of the silylation gas by the later heating via elevating temperature.

As for the temperature of the substrate 1, the temperature in the step 103 may be maintained as it is, or no heating may be made. The temperature may also be lower than the heating temperature in step 107 as discussed later.

Step 107: The substrate 1 having the organic silica insulating film 2 formed thereon is heated.

The substrate 1 is exposed to the radiation of the infrared lamp 4 from the downward direction to be rapidly heated. This allows reducing the time required for the hydrophobizing treatment for the organic silica insulating film 2.

It is preferable that the heating temperature is higher than the temperature of the substrate 1 in the step 103.

The heating temperature of the substrate 1 may be preferably equal to or higher than 350 degrees C. This causes the reaction of the silylation gas and the organic silica insulating film 2 to achieve the hydrophobization of the surfaces of the pores within the organic silica insulating film 2. On the other hand, the heating temperature of the substrate 1 may be preferably equal to or lower than 450 degrees C. This allows the smooth reaction of the silylation gas and the organic silica insulating film 2 to further reduce the time required for the hydrophobizing treatment for the organic silica insulating film 2.

In addition, the substrate 1 is continuously heated after the gaseous mixture 3 is introduced into the apparatus in the step 105 to achieve the reaction without excess and deficiency of only the portion of the silylation gas that is adsorbed to the organic silica insulating film with the organic silica insulating film 2 in the step 103.

Advantageous effects of the present embodiment will be described.

The microporous film has large surface area due to the pores itself has, and therefore the adsorption of water is easily occurred. Since water has larger specific dielectric constant of 80, the adsorption of water in the film causes a problem of the increased specific dielectric constant of the entire microporous film. Another problem of the water adsorption is that "—Si—O—Si—" structure for forming the microporous film reacts with $H_2O$ to break the bonds to create Si—OH structure, deteriorating the elastic modulus of the microporous film.

On the contrary, the organic silica insulating film 2 according to the present embodiment is treated by supplying the gaseous mixture 3 composed of the silylation gas and the inert gas into the apparatus in the condition that the temperature of the substrate 1 is equal to or higher than the dew point of the silylation gas and equal to or lower than the vaporizing temperature thereof, so that the silylation gas diffuses over the surface and the interior pores of the organic silica insulating film 2 to provide the hydrophobization thereto.

Besides, while the configuration of mere supplying the steam or the liquid containing silylation agent as in the above-described Patent Document 4 provides insufficient hydrophobizing effect, the configuration of the present embodiment, which employs the gaseous mixture composed of the silylation gas and the inert gas and utilizes the temperature of the substrate 1 as being equal to or higher than the dew point of the silylation gas and equal to or lower than the vaporizing temperature thereof, achieves the effect of hydrophobizing the surface of and the pore surfaces within the organic silica insulating film 2 (microporous film).

This allows obtaining the hydrophobized organic silica insulating film with reduced increase in the specific dielectric constant.

In addition, in the process for manufacturing the semiconductor device, the operations for causing the water adsorption for the microporous film, or in other words, the operations for exposing the microporous film included in the semiconductor device are occurred in the occasions of, for example, after the formation of the microporous film, after the dry etching process and before depositing a barrier metal, or when the etching mask is not a resist, in the occasions of after the dry etching process, after an asking process, and after the cleaning process. In addition, the operations for possibly causing an introduction of the gas into the microporous film through the film disposed on the surface thereof without exposing the microporous film are occurred in the occasions of after forming the barrier metal and after a Cu-CMP process.

According to the process for manufacturing the hydrophobized microporous film according to the present embodiment, increased specific dielectric constant by the water adsorption of the organic silica insulating film 2 (microporous film) included in the semiconductor device adsorbs with water in such operations can be inhibited. In addition, a problem of a shape defect in the process for patterning the microporous film of the semiconductor device due to the precipitation of the hydrophobizing gas on the surface of the microporous film can be inhibited.

The process for manufacturing the hydrophobized microporous film according to the present invention is not limited to the above-described embodiments, and various modifications may be available.

It is sufficient for serving as the microporous film of the present invention to be taken with the hydrophobizing gas diffusing in the film, and the structure of the pores are not particularly limited. The open-type pore means a pore, in which the hydrophobizing gas can diffuse from the surface of a microporous film to the inside thereof. The confirmation on whether or not the hydrophobizing gas diffuses in the microporous film may be achieved by, for example, contacting the film with the hydrophobizing gas in a closed vessel and detecting a decrease of the quantity of the hydrophobizing gas or an increase in the mass of the film. Alternatively, such confirmation may be achieved by irradiating the microporous film with x-ray and detecting a generation of scattering.

While the materials for the microporous film is not particularly limited, materials having Si—O as a main component and having Si—O—Si bonds is preferable for the microporous film. Materials exhibiting poor hydrophobic property may be employed for the microporous film, and typical materials may include, for example, porous silica, or other materials such as ultra-low specific dielectric constant interlayer insulating film, microporous interlayer film, porous silica, microporous methyl silsesquioxane (MSQ), microporous SiOCH and the like.

Water, which is originally contained in the microporous film, is not necessary to be particularly eliminated, and thus the similar advantageous effects as obtained in the present embodiment can also be obtained without removing such originally-contained water.

Available substrate for the present invention typically includes silicon substrate, silicon on insulator (SOI) substrate and compound semiconductor substrate and the like. In the process for manufacturing the semiconductor device, elements such as transistor, resistor and the like and interconnect layers for providing coupling between elements may be preliminarily formed in the surface of the substrate.

Available silylation gas is not particularly limited to specific gas, and gases containing an organosilane compound having hydrophobic group is preferable. More specifically, specific examples include: HMDS (hexamethyldisilazane: boiling point is 125 to 126 degrees C., and dew point at the vapor pressure of 2.7 kPa is about 20 degrees C.); TMCTS (1,3,5,7-tetramethyl cyclotetrasiloxane: boiling point is 135 degrees C., and dew point at the vapor pressure of 5.33 kPa is about 60 degrees C.); OMCTS (1,1,3,3,5,5,7,7-ortho methyl cyclotetrasiloxane: boiling point is 175 to 176 degrees C., and dew point at the vapor pressure of 5.33 kPa is about 90 degrees C.); and the like. This allows the hydrophobization of the microporous film. In particular, TMCTS is preferable. TMCTS has no —N—Si— structure, and therefore is difficult to be degraded and is not reactive at a temperature equal to or lower than 350 degrees C. Therefore, the reaction of the microporous film with TMCTS is not started during the supply of the gaseous mixture, and rapidly proceeds in the later heating operation. This allows obtaining the hydrophobized microporous film with reduced increase in the specific dielectric constant in shorter time.

Available heating process is not particularly limited to the radiation of the infrared lamp, and processes, which are capable of rapidly heating the substrate, may be employed. Available processes include, for example: a process for heating by moving the substrate closer to a high-temperature body; a process for heating by elevating a temperature of a Peltier element that is in contact with the substrate; a process for heating by employing a microwave heating; a process for heating by exposing the substrate with a noble gas plasma; a process for heating by spraying a high-temperature gas over a substrate, and the like, and one of these processes may be employed alone, or combinations of plurality of these processes may alternatively be employed.

EXAMPLES

The present invention will be more specifically described in reference to examples below. The scope of the present invention is not limited to these examples.

Example 1

A silicon substrate was coated with an aqueous mixture of siloxane, an acid, and an organic monomer, and the temperature of the silicon substrate was stepwise performed elevated from 100 degrees C. to 400 degrees C. within a nitrogen atmosphere. Such temperature-elevation caused formation of aggregated material of the organic monomer, and siloxane was polymerized so as to surround the aggregated material, and then the aggregated material of the organic monomer was thermally decomposed to form an organic silica insulating film having open type pores. The silicon substrate having the organic silica insulating film formed thereon was obtained in such way.

Next, the silicon substrate having the organic silica insulating film formed thereon was disposed in a vacuum chamber, and the chamber was evacuated to a vacuum of about 0.01 Pa by employing a dry pump.

The temperature of the silicon substrate was maintained at about 50 degrees C. with the infrared lamp, while the evacuation was continued.

In next, a gaseous mixture of hexamethyldisilazane generated by vaporizing with a heating-type vaporizer and nitrogen carrier gas was supplied into the chamber at a rate of 2 liters per minute, the pressure in the chamber was maintained at 1 kPa, and the silicon substrate was exposed to the gaseous mixture for one minute.

Next, the supply of the gaseous mixture was stopped, and the output of the infrared lamp was increased to elevate the temperature of the silicon substrate temperature up to 400 degrees C., and then such condition was maintained for 1 to 10 minutes (time for hydrophobizing treatment). Then, the temperature of the silicon substrate was decreased, and then the silicon substrate was removed from the inside of the chamber.

In addition to above, since the dew point of hexamethyldisilazane is changed in accordance with the pressure of the gaseous mixture, the temperature of the silicon substrate was set to about 50 degrees C. at the pressure in the chamber of 1 kPa so that the substrate temperature is equal to or higher than the dew point of hexamethyldisilazane and equal to or lower than the vaporizing temperature thereof.

Comparative Example 1

The silicon substrate having the organic silica insulating film formed thereon was obtained similarly as in Example 1.

Comparative Example 1 includes, unlikely as in Example 1, no process for supplying a gaseous mixture at a temperature of the silicon substrate of equal to or higher than the dew point of hexamethyldisilazane and equal to or lower than the vaporizing temperature thereof.

Next, the silicon substrate was disposed within a vacuum quartz chamber, and the chamber was evacuated to about 0.01 Pa by employing a dry pump.

The temperature of the silicon substrate was maintained at about 400 degrees C. with the infrared lamp, while the evacuation was continued.

In next, a gaseous mixture of hexamethyldisilazane generated by vaporizing with a heating-type vaporizer and nitrogen carrier gas was supplied into the chamber at a rate of 2 liters per minute, the pressure in the chamber was maintained at 1 kPa, and the silicon substrate was exposed to the gaseous mixture for 10 to 30 minutes (time for hydrophobizing treatment). Then, the supply of the gaseous mixture was stopped, and the temperature of the silicon substrate was decreased by decreasing the output of the infrared lamp, and then the silicon substrate was removed from the inside of the chamber.

The porous silica films on the silicon substrates obtained in Example 1 and Comparative Example 1 are picked out from the chamber to be exposed to the air.

Figure 2:
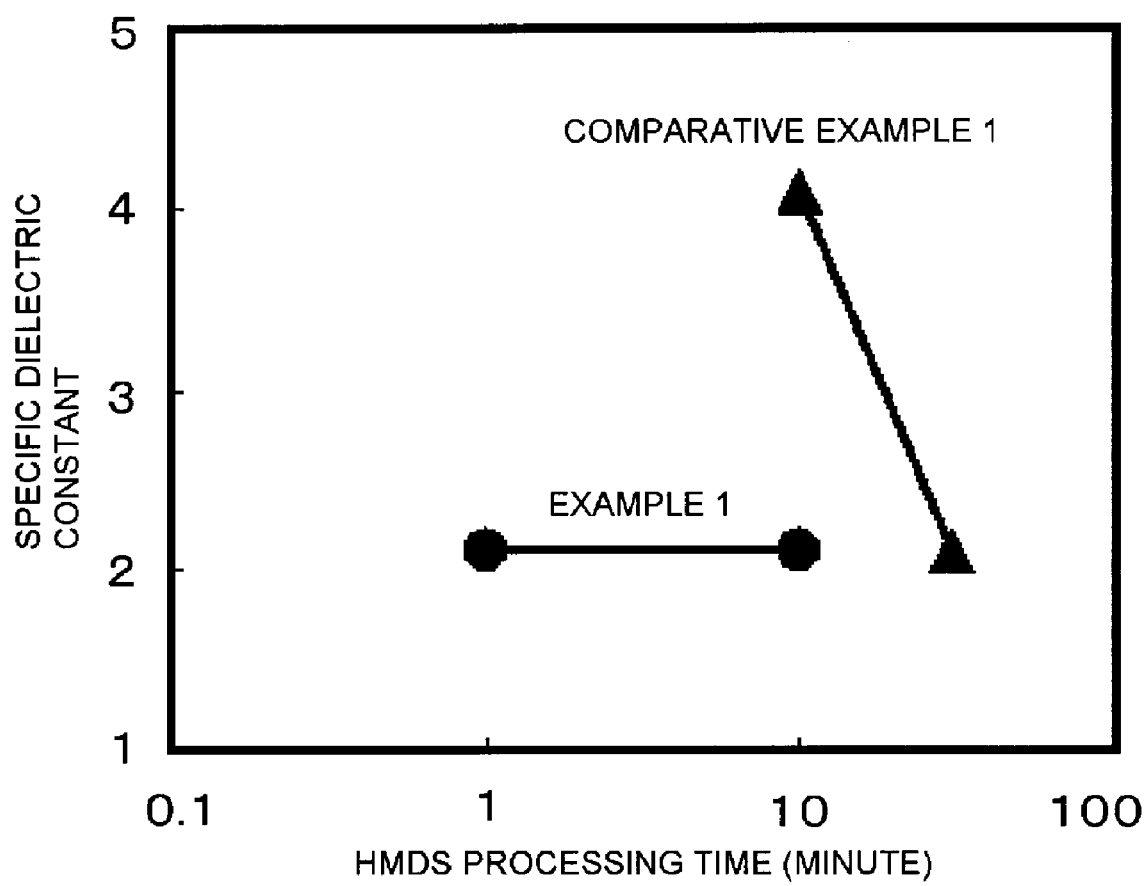
FIG. 2 is a graph, showing relations of specific dielectric constant of a porous silica film over elapsed time for hydrophobizing processing.

FIG. 2 is a graph, showing relations of specific dielectric constant of a porous silica film over the elapsed time for the hydrophobizing treatment for the substrates obtained in Example 1 and Comparative Example 1.

The relation shows that larger hydrophobizing effect provides smaller quantity of water adsorption on the surface and the surface of the pores in the porous silica film, reducing an increase in the specific dielectric constant of the porous silica film.

The measurement of the specific dielectric constant was conducted by measuring a capacitance of the porous silica film in the condition of being contact with a mercury electrode, and then calculating the specific dielectric constant from the capacitance, the dimensional area of the mercury electrode and the thickness of the porous silica film.

As shown in FIG. 2, the specific dielectric constant of the porous silica film in Comparative Example 1 was 4 in the condition that the time for the hydrophobizing treatment was 10 minutes, and was 2 in the condition that the time for the hydrophobizing treatment was 30 minutes. On the contrary, the specific dielectric constant of the porous silica film in Example 1 was 2 in the condition that the time for the hydrophobizing treatment was within a range of from 1 minute to 10 minutes.

It was found from the above-described results that further improved hydrophobizing effect was obtained by supplying the gaseous mixture under the condition that the temperature of the silicon substrate was equal to or higher than the dew point of hexamethyldisilazanet and equal to or lower than the vaporizing temperature thereof.

Example 2

The silicon substrate having the organic silica insulating film formed thereon was obtained similarly as in Example 1.

Next, the silicon substrate having the organic silica insulating film formed thereon was disposed in a vacuum chamber, and the chamber was evacuated to a vacuum of about 0.01 Pa by employing a dry pump.

The temperature of the silicon substrate was maintained at about 50 degrees C. with the infrared lamp, while the evacuation was continued.

In next, a gaseous mixture of tetramethyl cyclotetrasiloxane generated by vaporizing with a heating-type vaporizer and nitrogen carrier gas was supplied into the chamber at a rate of 2 liters per minute, the pressure in the chamber was maintained at 1 kPa to 30 kPa, and the silicon substrate was exposed to the gaseous mixture for 1 minute. Then, the supply of the gaseous mixture was stopped, and the temperature of the silicon substrate was elevated to a temperature of 400 degrees C. by increasing the output of the infrared lamp, and such condition was maintained for 30 minutes (time for hydrophobizing treatment). Then, the temperature of the silicon substrate was decreased, and the silicon substrate was removed from the inside of the chamber.

In addition to above, since the dew point of tetramethyl cyclotetrasiloxane is changed in accordance with the pressure of the gaseous mixture, the temperature of the silicon substrate was set to about 50 degrees C. at the pressure in the chamber of 1 kPa to 30 kPa so that the substrate temperature is equal to or higher than the dew point of tetramethyl cyclotetrasiloxane and equal to or lower than the vaporizing temperature thereof.

Comparative Example 2

The silicon substrate having the organic silica insulating film formed thereon was obtained similarly as in Example 1.

Comparative Example 2 includes, unlikely as in Example 1, no process for supplying a gaseous mixture at a temperature of the silicon substrate of equal to or higher than the dew point of tetramethyl cyclotetrasiloxane and equal to or lower than the vaporizing temperature thereof.

Next, the silicon substrate was disposed within a vacuum quartz chamber, and the chamber was evacuated to about 0.01 Pa by employing a dry pump.

The temperature of the silicon substrate was maintained at about 400 degrees C. with the infrared lamp, while the evacuation was continued. In next, a gaseous mixture of tetramethyl cyclotetrasiloxane generated by vaporizing with a heating-type vaporizer and nitrogen carrier gas was supplied into the chamber at a rate of 2 liters per minute, the pressure in the chamber was maintained at 1 kPa to 30 kPa, and the silicon substrate was exposed to the gaseous mixture for 10 to 30 minutes (time for hydrophobizing treatment).

Then, the supply of the gaseous mixture was stopped, and the temperature of the silicon substrate was decreased by decreasing the output of the infrared lamp, and then the silicon substrate was removed from the inside of the chamber.

Figure 3:
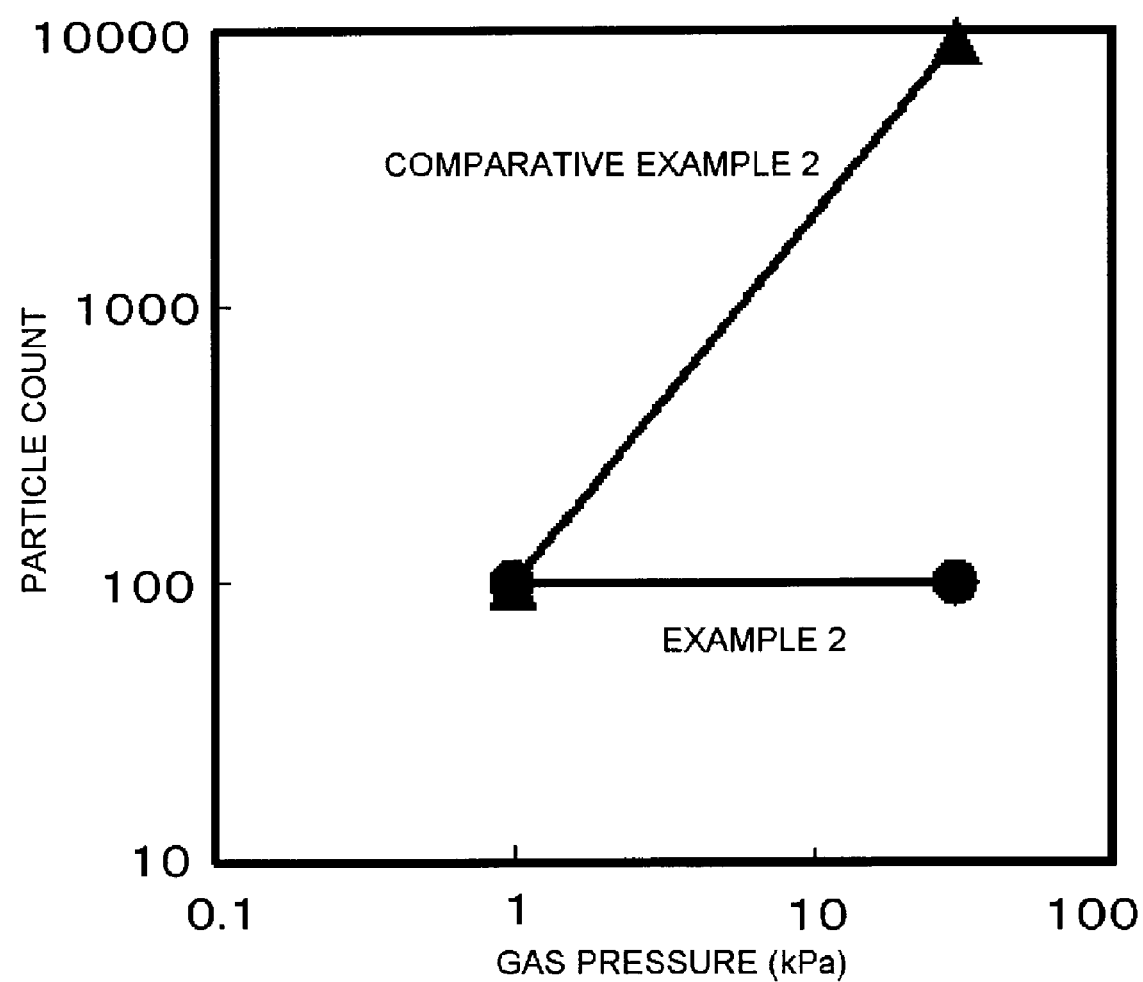
FIG. 3 is a graph, showing relations of silylation gas particle count on a surface of a porous silica film over pressure of a gaseous mixture.

FIG. 3 is a graph, showing relations of tetramethyl cyclotetrasiloxane (silylation gas) particle count on a surface of a porous silica film over pressure of a gaseous mixture in Example 2 and Comparative Example 2. Such particle count can be determined by employing a laser particle counter.

In Comparative Example 2, about 10,000 fine particles of tetramethyl cyclotetrasiloxane were precipitated on the substrate in the hydrophobizing treatment at the gaseous mixture pressure of 30 kPa. It is considered that the fine particles were created due to the increased pressure, since the reactivity of tetramethyl cyclotetrasiloxane contained in the gaseous mixture is larger. On the other hand, the fine particle count of tetramethyl cyclotetrasiloxane was not increased to be within the initial count for the hydrophobizing treatment at the pressure of the gaseous mixture of 1 kPa. However, no effect for inhibiting the increase of the specific dielectric constant was obtained, and thus the insufficient hydrophobizing effect was obtained. It is considered that the reason is that lower pressure of the gaseous mixture provides insufficient diffusion of tetramethyl cyclotetrasiloxane in the inside of the pores of the porous silica film, so that the hydrophobizing reaction did not progress in the inside of the film.

In Example 2, almost no generation of the fine particles of tetramethyl cyclotetrasiloxane was occurred, regardless of the level of the gaseous mixture pressure. It is considered that, even if the gaseous mixture pressure is 30 kPa, the excessive gaseous mixture on the silicon substrate evaporates to reduce the generation of the fine particles of tetramethyl cyclotetrasiloxane, since the supply of the gaseous mixture is stopped and the silicon substrate is heated after the pressure of the gaseous mixture is reduced. In addition, sufficient hydrophobizing effect was obtained even if the hydrophobizing treatment was conducted at a pressure of the gaseous mixture of 10 kPa.

It is considered that, since the gaseous mixture penetrates to the inside of the pores of the porous silica film before elevating the temperature of the silicon substrate and thereafter the silicon substrate is rapidly heated, sufficient quantity of tetramethyl cyclotetrasiloxane is reacted in the pores.

It was found from the above-described results that further improved hydrophobizing effect was obtained by supplying the gaseous mixture under the condition that the temperature of the silicon substrate was equal to or higher than the dew point of tetramethyl cyclotetrasiloxane and equal to or lower than the vaporizing temperature thereof. It was found from the above-described Examples and Comparative Examples that the hydrophobizing effect of the microporous film is obtained by employing the temperature of the silicon substrate as being equal to or higher than the dew point of the silylation gas and equal to or lower than the vaporizing temperature thereof and supplying the gaseous mixture composed of the silylation gas and the inert gas. In addition to above, when the temperature of the silicon substrate is set to be lower than the dew point of the silylation gas, sufficient hydrophobizing effect is not obtained.

The present application claims a Paris Convention priority based on Japanese patent application No. 2007-261,620 filed to the Japanese Patent Office on Oct. 5, 2007, the entire contents of which are hereby incorporated by reference.

What is claimed is:

1. A process for manufacturing a hydrophobized microporous film, including:

forming a microporous film on a substrate by a method consisting of forming a film including an aggregated material of an organic monomer and heating the substrate so that the aggregated material of the organic monomer is thermally decomposed, said heating being performed by a process selected from the group consisting of radiation by infrared lamp, moving the substrate closer to a high-temperature body, elevating a temperature of a Peltier element that is in contact with the substrate, employing microwave heating, spraying a high temperature gas over the substrate, and combinations thereof;

immediately after forming said microporous film, supplying a gaseous mixture composed of a silylation gas and an inert gas in an apparatus containing said substrate with said microporous film formed thereon at a temperature of said substrate and said temperature being equal to or higher than a dew point temperature of the silylation gas and equal to or lower than a vaporizing temperature of the silylation gas;

stopping the supply of said gaseous mixture into said apparatus and heating said substrate so that said microporous film has achieved a silylation in said apparatus.

2. The process for manufacturing the hydrophobized microporous film as set forth in claim 1, wherein said substrate is heated in said heating said substrate to a temperature being equal to or higher than 350° degree C. and equal to or lower than 450° degree C.

3. The process for manufacturing the hydrophobized microporous film as set forth in claim 1, wherein said silylation gas contains an organosilane compound having hydrophobic group.

4. The process for manufacturing the hydrophobized microporous film as set forth in claim 1, wherein said silylation gas contains at least one selected from the group consisting of hexamethyldisilazane, tetramethyl cyclotetrasiloxane and ortho methyl cyclotetrasiloxane.

5. The process for manufacturing the hydrophobized microporous film as set forth in claim 1, wherein said microporous film is composed of a material having Si—O—Si bonds.

6. The process for manufacturing the hydrophobized microporous film as set forth in claim 1, wherein said substrate is heated in said heating said substrate to a temperature that is higher than a temperature for said silylation.

7. The process for manufacturing the hydrophobized microporous film as set forth in claim 1, wherein said substrate is heated in said heating said substrate in a rapid thermal apparatus.

8. The process for manufacturing the hydrophobized microporous film as set forth in claim 1, wherein said inert gas is helium gas or nitrogen gas.

* * * * *